US010670662B2

(12) United States Patent
Wu et al.

(10) Patent No.: US 10,670,662 B2
(45) Date of Patent: Jun. 2, 2020

(54) METHOD AND APPARATUS FOR CALIBRATING COULOMB COUNTING BASED STATE-OF-CHARGE ESTIMATION

(71) Applicant: MEDIATEK INC., Hsin-Chu (TW)

(72) Inventors: Jui-Chi Wu, Taichung (TW); Jia-You Chuang, Hsinchu County (TW); Wan-Yi Horng, Hsinchu (TW); Jui Wang, Taichung (TW)

(73) Assignee: MEDIATEK INC., Hsin-Chu (TW)

( * ) Notice: Subject to any disclaimer, the term of this patent is extended or adjusted under 35 U.S.C. 154(b) by 296 days.

(21) Appl. No.: 15/447,128

(22) Filed: Mar. 2, 2017

(65) Prior Publication Data

US 2018/0252775 A1 Sep. 6, 2018

(51) Int. Cl.
*G01R 31/367* (2019.01)
*H01M 10/48* (2006.01)
*G01R 31/3828* (2019.01)

(52) U.S. Cl.
CPC ....... *G01R 31/367* (2019.01); *G01R 31/3828* (2019.01); *H01M 10/48* (2013.01); *H01M 2220/30* (2013.01)

(58) Field of Classification Search
None
See application file for complete search history.

(56) References Cited

U.S. PATENT DOCUMENTS

| 6,356,083 | B1* | 3/2002 | Ying | G01R 31/3828 324/426 |
| 6,646,419 | B1* | 11/2003 | Ying | B60W 10/26 320/132 |
| 2012/0049802 | A1* | 3/2012 | Barsukov | G01R 31/367 320/136 |
| 2013/0038292 | A1* | 2/2013 | Barrett | G01R 31/3833 320/134 |
| 2013/0297243 | A1 | 11/2013 | Baba | |
| 2016/0061908 | A1* | 3/2016 | Torai | G01R 31/3648 702/63 |
| 2018/0100899 | A1* | 4/2018 | Wu | G01R 31/374 |

FOREIGN PATENT DOCUMENTS

| CN | 103038657 A | 4/2013 |
| CN | 103328997 A | 9/2013 |
| TW | 201133985 A1 | 10/2011 |
| TW | 201239382 A1 | 10/2012 |
| TW | 201421056 A | 6/2014 |

* cited by examiner

*Primary Examiner* — Paresh Patel
(74) *Attorney, Agent, or Firm* — Winston Hsu (57) ABSTRACT

A method for calibrating a coulomb counting based state-of-charge (SOC) estimation of a battery cell includes: determining whether the battery cell is in a specific charge state; calibrating an initial value for use in the coulomb counting based SOC estimation according to an open circuit voltage (OCV)-based SOC of the battery cell if the battery cell is not in the specific charge state; calibrating the initial value according to a predetermined value if the battery cell is in the specific charge state; and applying the calibrated initial value to the coulomb counting based SOC estimation and restarting an integration of the coulomb counting based SOC estimation based on the calibrated initial value.

5 Claims, 5 Drawing Sheets

METHOD AND APPARATUS FOR CALIBRATING COULOMB COUNTING BASED STATE-OF-CHARGE ESTIMATION

BACKGROUND

The present invention relates to battery state-of-charge (SOC) estimation, and more particularly to methods and apparatus for calibrating coulomb counting based SOC estimation.

Batteries are used in numerous applications, such as portable devices, smartphones, laptops, tablets and so on. It is important for the user to know an amount of available energy remaining in a battery and when the battery needs to be charged, so as to avoid the battery running out of energy.

An amount of charges remained in the battery is usually expressed by state of charge (SOC), which is in form of a percentage of a maximum battery capacity. Usually, 100% SOC state means a battery cell is fully charged, while 0% SOC state means the battery cell is fully discharged.

There are several approaches to estimate the SOC of the battery cell. One of the approaches is open circuit voltage (OCV)-based SOC estimation that is mainly based on an open circuit voltage (OCV) of the battery cell. This approach measures potential difference between terminals of the battery cell to obtain the OCV and translate the measured OCV into the SOC according to a known OCV-SOC curve, which defines relationship between OCV and SOC values. However, due to an internal impedance of the battery cell, it is difficult to accurately measure the OCV especially when a current flowing through the battery cell is high. Another approach is to integrate a current flowing into or out of the battery cell to count a total charge amount that have flown through the battery cell, thereby estimating a relative SOC change within a given period of time, which is as known as coulomb counting. However, as the coulomb counting only estimates the relative SOC change, it is necessary to estimate an initial value, which is the SOC value at the time the current starts to be integrated. Accordingly, by applying the relative SOC change to the initial value, the actual SOC can be therefore determined.

Even when the above-mentioned coulomb counting based SOC estimation is considerably accurate when compared to OCV-based SOC estimation, there are still errors in the coulomb counting based SOC estimation. This is because the SOC of a battery cell is dependent on its inherent chemical characteristics and characteristics of the electrical system that draws power from the battery cell. Lot of reasons, such as battery aging or battery temperature may lead to inaccurate estimation of the initial value. Furthermore, a change of a loading on the battery cell also causes the error in estimating the relative SOC change because the change of the loading on the battery cell affects a maximum battery capacity, which further affects the computation of the relative SOC change. In view of this, the coulomb counting based SOC estimation requires to be calibrated on a regular basis to guarantee an accurate SOC estimation.

SUMMARY

With this in mind, it is one objective to provide methods for calibrating the SOC estimation. In one aspect of the present invention, a method calibrates the coulomb counting based SOC estimation correcting the initial value. This method has different approaches to correcting the initial value, which depends on one or more states of the battery cell. In another aspect of the present invention, a method calibrates the estimation of the relative SOC change by correcting an error between a nominal maximum battery capacity and an available maximum battery capacity.

According to one embodiment of the present invention, a method for calibrating a coulomb counting based state-of-charge (SOC) estimation of a battery cell is provided, comprising: determining whether the battery cell is in a specific charge state; calibrating an initial value for use in the coulomb counting based SOC estimation according to an open circuit voltage (OCV)-based SOC of the battery cell if the battery cell is not in the specific charge state; calibrating the initial value according to a predetermined value if the battery cell is in the specific charge state; and applying the calibrated initial value to the coulomb counting based SOC estimation and restarting an integration of the coulomb counting based SOC estimation based on the calibrated initial value.

According to one embodiment of the present invention, an apparatus for calibrating a coulomb counting based state-of-charge (SOC) estimation of a battery cell is provided, comprising: a battery state determination circuit, an open circuit voltage (OCV)-based calibration circuit, a default value based calibration circuit. The battery state determination circuit is arranged to determine whether the battery cell is in a specific charge state. The OCV-based calibration circuit is coupled to the battery state determination circuit, and arranged to calibrate an initial value for use in the coulomb counting based SOC estimation according to an OCV-based SOC of the battery cell if the battery state determination circuit determines the battery cell is not in the specific charge state, and apply the calibrated initial value to the coulomb counting based SOC estimation and control an integration of the coulomb counting based SOC estimation to be restarted based on the calibrated initial value. The default value based calibration circuit is coupled to the battery state determination circuit, and arranged to calibrate the initial value according to a default value if the battery state determination circuit determines the battery cell determines the battery cell is in the specific charge state, and apply the calibrated initial value to the coulomb counting based SOC estimation and control an integration of the to the coulomb counting based SOC estimation to be restarted based on the calibrated initial value.

According to one embodiment of the present invention, a method for calibrating a coulomb counting based state-of-charge (SOC) estimation of a battery cell is provided, comprising: calculating an average discharge current of the battery cell; determining an instant available maximum battery capacity of the battery cell according to the average discharge current; determining an adjusting factor according to the instant available maximum battery capacity; and calibrating a relative SOC change for use in the coulomb counting based SOC estimation according to the adjusting factor.

According to one embodiment of the present invention, an apparatus for calibrating a coulomb counting based state-of-charge SOC estimation of a battery cell is provided, comprising: an average discharge current calculation circuit, a battery capacity determination circuit, an adjusting factor calculation circuit, and a calibration circuit. The average discharge current calculation circuit is arranged to calculate an average discharge current of the battery cell. The battery capacity determination circuit is coupled to the average discharge current calculation circuit, and arranged to determine an instant available maximum battery capacity of the battery cell according to the average discharge current. The adjusting factor calculation circuit is coupled to the battery capacity determination circuit, and arranged to determine an adjusting factor according to the instant available maximum battery capacity. The calibration circuit is coupled to the adjusting factor calculation circuit and arranged to calibrate a relative SOC change for use in the coulomb counting based SOC estimation according to the adjusting factor.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following descriptions and claims to refer to particular system components. As one skilled in the art will appreciate, manufacturers may refer to a component by different names. This document does not intend to distinguish between components that differ in name but not differ in functionality. In the following discussion and in the claims, the terms "include", "including", "comprise", and "comprising" are used in an open-ended fashion, and thus should be interpreted to mean "including, but not limited to . . . " The terms "couple" and "coupled" are intended to mean either an indirect or a direct electrical connection. Thus, if a first device couples to a second device, that connection may be through a direct electrical connection, or through an indirect electrical connection via other devices and connections.

Reference throughout this specification to "one embodiment", "an embodiment", "one example" or "an example" means that a particular feature, structure or characteristic described in connection with the embodiment or example is included in at least one embodiment of the present embodiments. Thus, appearances of the phrases "in one embodiment", "in an embodiment", "one example" or "an example" in various places throughout this specification are not necessarily all referring to the same embodiment or example. Furthermore, the particular features, structures or characteristics may be combined in any suitable combinations and/or sub-combinations in one or more embodiments or examples.

Embodiments of the present invention may be implemented as an apparatus, method, or computer program product. Accordingly, these embodiments may be implemented with entire hardware combinations, entire software combinations, such as software, firmware, instructions, micro codes, etc., or mixing of software and hardware combinations. In the following, all the possible combinations are referred to as a "block", "functional block" or "system."

Flowcharts in the drawings illustrate the architecture, functionality, and operation of possible implementations of systems, methods, and computer program products according to various embodiments of the present embodiments. Each block in the flowchart may represent a module, segment, or portion of code, which comprises one or more executable instructions for implementing the specified logical functions. It will also be noted that each block of flowchart illustrations may be implemented by special/general purpose hardware-based systems that perform the specified functions or acts, or combinations of special purpose hardware and computer instructions. These executable instructions may be stored in a computer-readable medium that can direct a computer or other programmable data processing apparatus to function in a particular manner.

Figure 1:
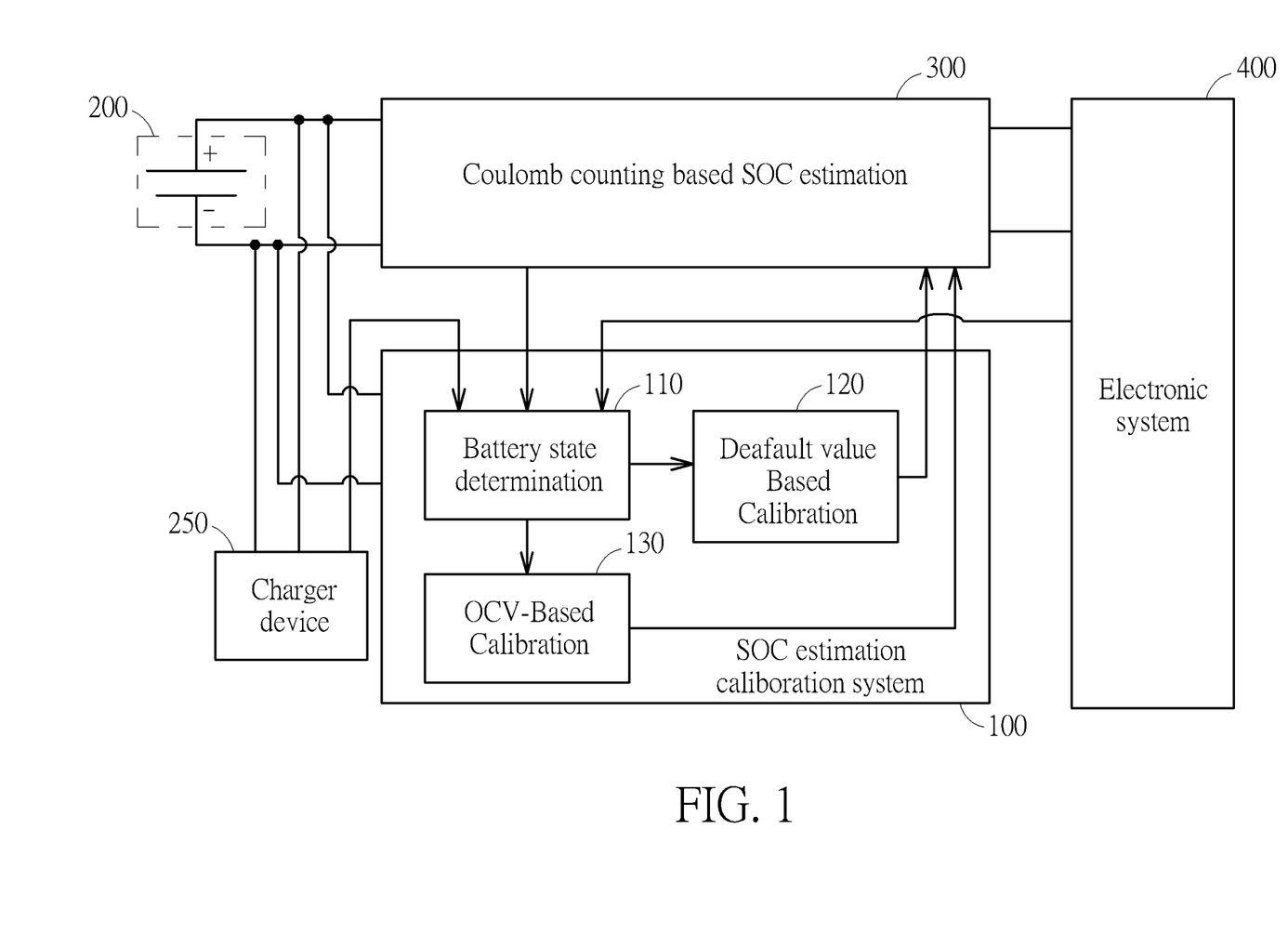
FIG. 1 illustrates an SOC estimation calibration system according to one embodiment of the present invention.

Please refer to FIG. 1, which illustrates a SOC estimation calibration system 100 according to one embodiment of the present invention. The SOC estimation calibration system 100 is employed for calibrating an initial value that is for use in a coulomb counting based SOC computation block 300, wherein the coulomb counting based SOC computation block 300 is used to estimate a SOC of a battery cell 200 based on an initial value and a relative SOC change. The coulomb counting based SOC computation block 300 estimate the relative SOC change by integrating the current into or out of the battery cell 200. Accordingly, the coulomb counting based SOC computation block 300 applies the relative SOC change to a determined initial value to obtain an estimated value for the SOC of the battery cell 200.

As mentioned above, there are errors in the SOC estimation, the SOC estimation calibration system 100 needs to compensate these errors as possibly. The SOC estimation calibration system 100 of the present invention is able to calibrate the initial value in four different approaches. The selection of approaches to calibrating depends on one or more state of the battery cell 200. Please refer to FIG. 1 in conjunction with a processing flow of the SOC estimation calibration system 100 illustrated in FIG. 2 for better understanding.

Figure 2:
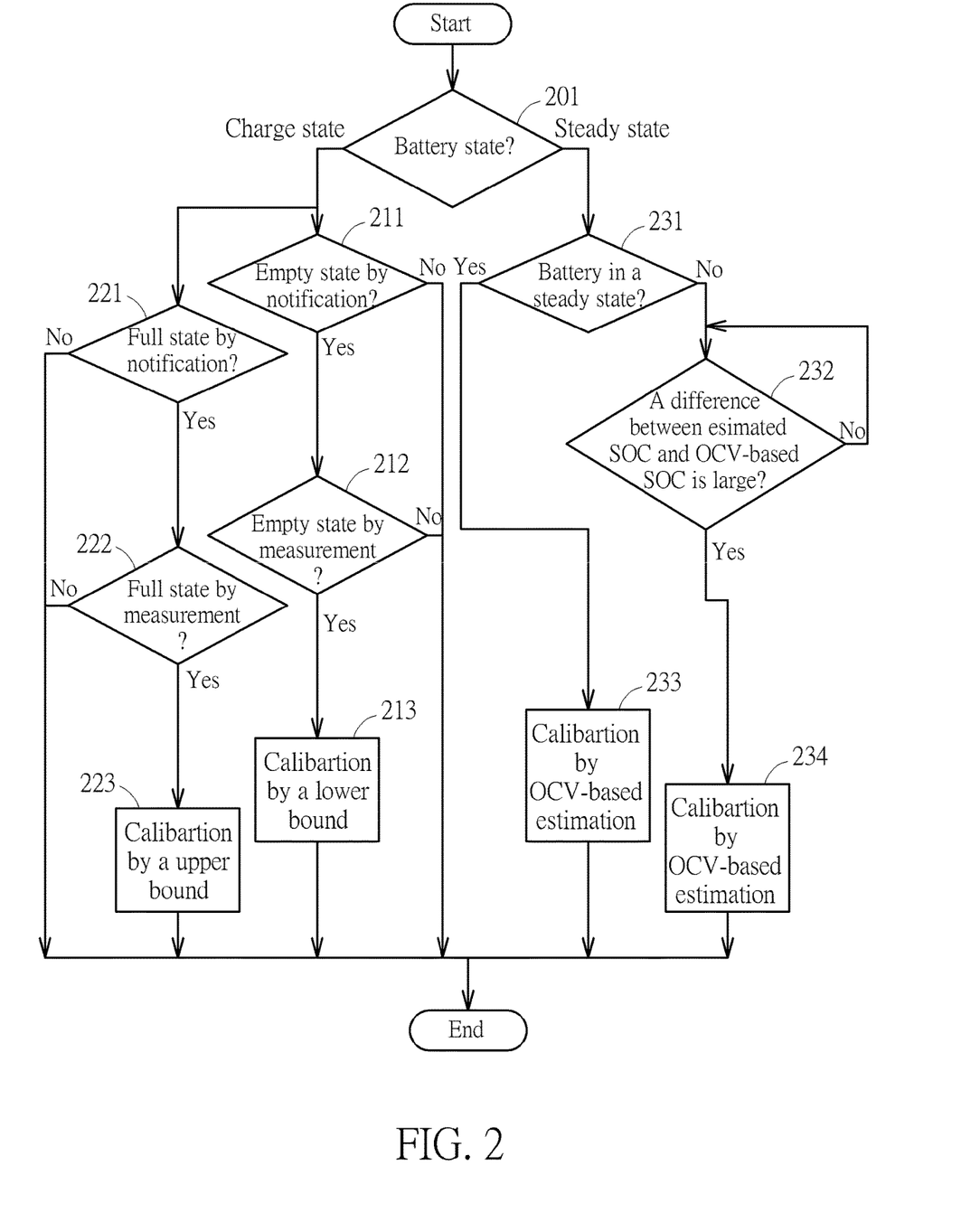
FIG. 2 illustrates a processing flow of the SOC estimation calibration system of FIG. 1 according to one embodiment of the present invention.

At step 201, a battery state determination circuit 110 of the SOC estimation calibration system 100 determines whether the battery cell 200 is in a specific charge state. The specific charge state refers to an empty state and/or a full state of the battery cell 200. Being in the empty state means the battery cell 200 is fully discharged and reaches to its cut-off voltage, which can be detected by a notification sent by an electronic system 400 that is powered by the battery cell 200 (step 211). Typically, when the battery cell 200 reaches its cut-off voltage, hardware components (not shown) in the electronic system 400 will trigger the electronic system 400 to send such notification because a low voltage level of the battery cell 200 may not be sufficient enough to drive these hardware components or even cause the damage to the battery cell 200 or the hardware components. When the battery determination circuit 110 receives the notification indicating the empty state, the flow may goes to step 213 for calibrating the initial value or goes to an optional step 212 for double-checking the empty state according to current and voltage measurements on the battery cell 200. If the empty state of the battery cell 200 is confirmed according to the empty state notification and/or the current and voltage measurements, the flow goes to step 213, otherwise the flow ends. At step 213, a default value based calibration block 120 calibrates the initial value. Specifically, the default value based calibration block 120 sets the initial value that is being used in the coulomb counting based SOC computation block 300 as a lower bound of the SOC of the battery cell 200, which could be 0% or other percentage values close to 0%. Accordingly, the default value based calibration block 120 controls the coulomb counting based SOC computation block 300 to reset accumulated integration data and restart a new integration so as to obtain a relative SOC change with respect to the new initial value of SOC.

Being in the full state means the battery cell 200 is fully charged and reaches to its nominal maximum voltage, which can be detected by a notification sent by a charge device 250 which charges the battery cell 200 (step 221). Typically, the charge device 250 is able to know the battery cell 200 is fully charged and accordingly send a full state notification. When the battery determination circuit 110 receives the full state notification, the flow may goes to step 223 for calibrating the initial value or goes to an optional step 222 for double-checking the full state according to current and voltage measurements on the battery cell 200. If the full state of the battery cell 200 is confirmed by the full state notification and/or current and voltage measurements, the flow goes to step 223, otherwise the flow ends. At step 223, the default value based calibration block 120 calibrates the initial value. Specifically, the default value based calibration block 120 sets the initial value that is being used in the coulomb counting based SOC computation block 300 as an upper bound of the SOC of the battery cell 200, which could be 100% or other percentage values close to 100%. Accordingly, the default value based calibration block 120 controls the coulomb counting based SOC computation block 300 to reset accumulated integration data and restart a new integration from the 100% SOC.

Furthermore, if the battery state determination block 110 determines the battery cell 200 is neither in the full state nor in the empty state, an OCV-based calibration block 130 will be used to calibrate the initial value. Before the OCV-based calibration block 130 is used to calibrate the initial value, the battery state determination block 110 is further used to check whether the battery cell 200 is in a steady state (step 231). This is because the OCV-based calibration block 130 calibrates the initial value based on the OCV of the battery cell 200. The OCV estimation is affected by the stability of the battery cell 200. The OCV-based calibration block 130 needs to calibrate more conservatively.

If the battery cell 200 is not in a steady state, the calibration result of the OCV-based calibration block 130 will be not very accurate. Hence, the battery state determination 110 determines whether the battery cell 200 is in the steady state at step 231. Specifically, according to whether the electronic system 400 remains in a sleep state for a given period of time, such as 30 mins, and whether a change of an amount of charges in the battery cell 300 within the given period of time is below than a charge amount threshold. The change of the amount of charges in the battery cell 300 can be obtained by integrating an average discharge current over the given period of time (e.g. the accumulated integration data that is generated by the coulomb counting based SOC computation block 300). Once both condition meets, the battery cell 200 is determined as in the steady state and the flows goes to step 233. At step 233, as the battery cell 300 is in the steady state, the OCV-based calibration block 130 obtains an instant OCV of the battery cell 200 from an OCV measurement circuit or measuring the OCV by itself. Accordingly, the OCV-based calibration block 130 determines an OCV-based SOC according to a look-up table (LUT) that is inside or outside the OCV-based calibration block 130, storing the OCV values associated with the SOC values. Once the SOC value that is associated with the instantly measured OCV is found, the OCV-based calibration block 130 sets the initial value that is being used in the coulomb counting based SOC computation block 300 as the OCV-based SOC, and controls the coulomb counting based SOC computation block 300 to reset accumulated integration data and restart a new integration from the calibrated initial value.

However, if the battery cell is determined not in the steady state at step 231, the OCV-based calibration block 130 calibrates the initial value only when there is a significant difference between the OCV-based SOC and the estimated SOC. When the battery cell 200 is determined not in the steady state, the OCV-based calibration block 130 derives OCV of the battery cell 200 that is periodically obtained either by an external OCV measurement circuit or measuring itself. According to the periodically derived OCVs, the OCV-based calibration block 130 translates the periodically derived OCVs to the OCV-based SOCs and compares the OCV-based SOCs with estimated values of the SOC obtained by the block 300 periodically. Only when the difference between the OCV-based SOC and the estimated value of SOC is higher than a threshold, the OCV-based calibration block 130 calibrates the initial value. At step 234, once it is found the difference is larger enough, the OCV-based calibration block 130 sets the initial value that is being used in the coulomb counting based SOC computation block 300 as the OCV-based SOC, and controls the coulomb counting based SOC computation block 300 to reset accumulated integration data and restart a new integration from the calibrated initial value.

As mentioned above, other factors causing inaccurate estimation of SOC are the loading on the battery cell and the aging of the battery cell. The following descriptions will explain how to calibrate errors caused by the loading on the battery cell and the aging of the battery cell.

Due to the internal resistance of the battery cell, the SOC estimation will be significantly affected when the current flowing through the batter cell 200 is large. As mentioned, the SOC estimation by the coulomb counting relies on the relative SOC change. Typically, the relative SOC change is determined a ratio of ($Q_{INT}/Q_{MAX}$), wherein $Q_{INT}$ is a total charge amount that have flown out of the battery cell 200 by integrating the current out of the battery cell 200, and $Q_{MAX}$ is a maximum battery capacity of the battery cell 200, which is usually applied by a nominal value when calculating the relative SOC change. However, the relative SOC change actually varies with the "actual"/"available" maximum battery capacity of the battery cell 200 and "actual"/"available" maximum battery capacity varies with the loading (i.e., the discharge current) and battery aging. Using a nominal value as the dominator in estimating the relative SOC change leads to errors. In a heavy loading condition, the estimation of the relative SOC change will become very inaccurate if still using a nominal value to calculate the ratio of ($Q_{INT}/Q_{MAX}$).

In view of this, the SOC estimation calibration system 500 adjusts the maximum battery capacity $Q_{MAX}$ by applying an adjusting factor to the nominal value of the maximum battery capacity $Q_{MAX}$ so as to reflect influence of the loading on the battery cell 200 and the battery aging. In other words, the dominator of the ($Q_{INT}/Q_{MAX}$) will be corrected as the "available" maximum battery capacity with respect to an instant loading of the battery cell 200 as well as the battery aging sate. A calibrated relative SOC change can be expressed as: $Q_{INT}/(Q_{MAX}*F_1*F_2)$, wherein $F_1$ is an adjusting factor which reflects the instant loading on the battery cell 200 and $F_2$ is an adjusting factor which reflects the battery aging sate. Furthermore, the product of adjusting factors $F_1$ and $F_2$ could be: $Q_{MAX\_INST}/Q_{MAX}$, wherein $Q_{MAX\_INST}$ is the available maximum battery capacity under the instant loading on the battery cell 200 and the instant battery aging state. Furthermore, to take the influence caused by the temperature of the battery cell 200 into consideration, the maximum battery capacity $Q_{MAX}$ may be also corrected according to a known relationship between the temperature and the maximum battery capacity $Q_{MAX}$.

The available maximum battery capacity $Q_{MAX\_INST}$ under the instant loading could be determined by two possible ways according to various embodiments of the present invention. In the first way, an average discharge current $I_{AVG}$ of the battery cell 200, reflecting the loading of the battery cell 200 is firstly determined. Accordingly, the available maximum battery capacity with respect to the instant loading of $I_{AVG}$ is determined according to a known relationship between a discharge current of the battery cell 200 and a corresponding available maximum battery capacity. In the second way, it is also firstly determined the average discharge current $I_{AVG}$ of the battery cell 200 to reflect the loading of the battery cell 200. Accordingly, the average discharge current $I_{AVG}$ of the battery cell 200 is used to derive an instant cut-off voltage with respect to the instant loading of $I_{AVG}$, and the available maximum battery capacity with respect to the instant loading of $I_{AVG}$ can be found according to a known relationship between an OCV of the battery cell 200 and a corresponding available maximum battery capacity of the battery cell 200.

Figure 3:
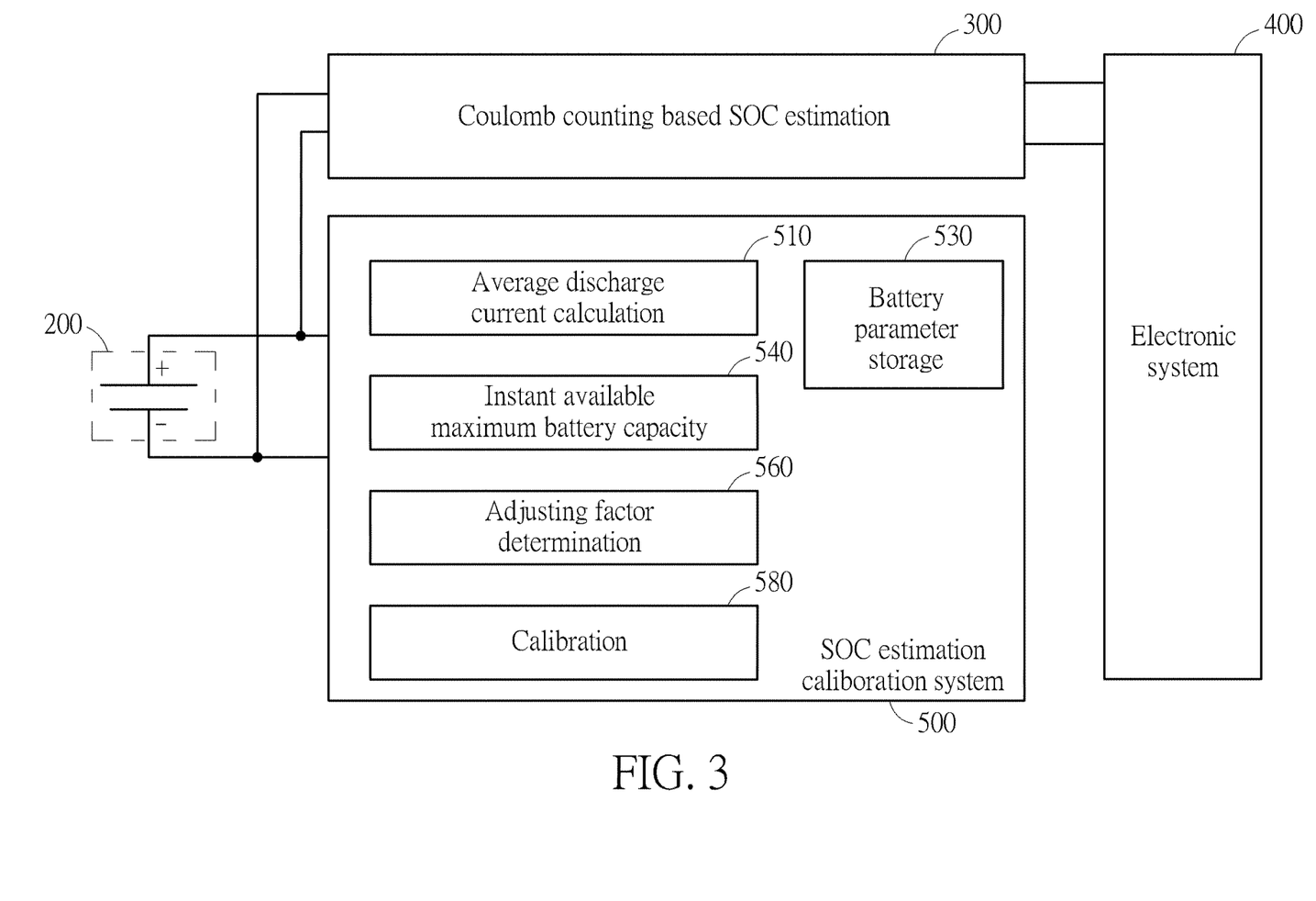
FIG. 3 illustrates an SOC estimation calibration system according to another embodiment of the present invention.
Figure 4:
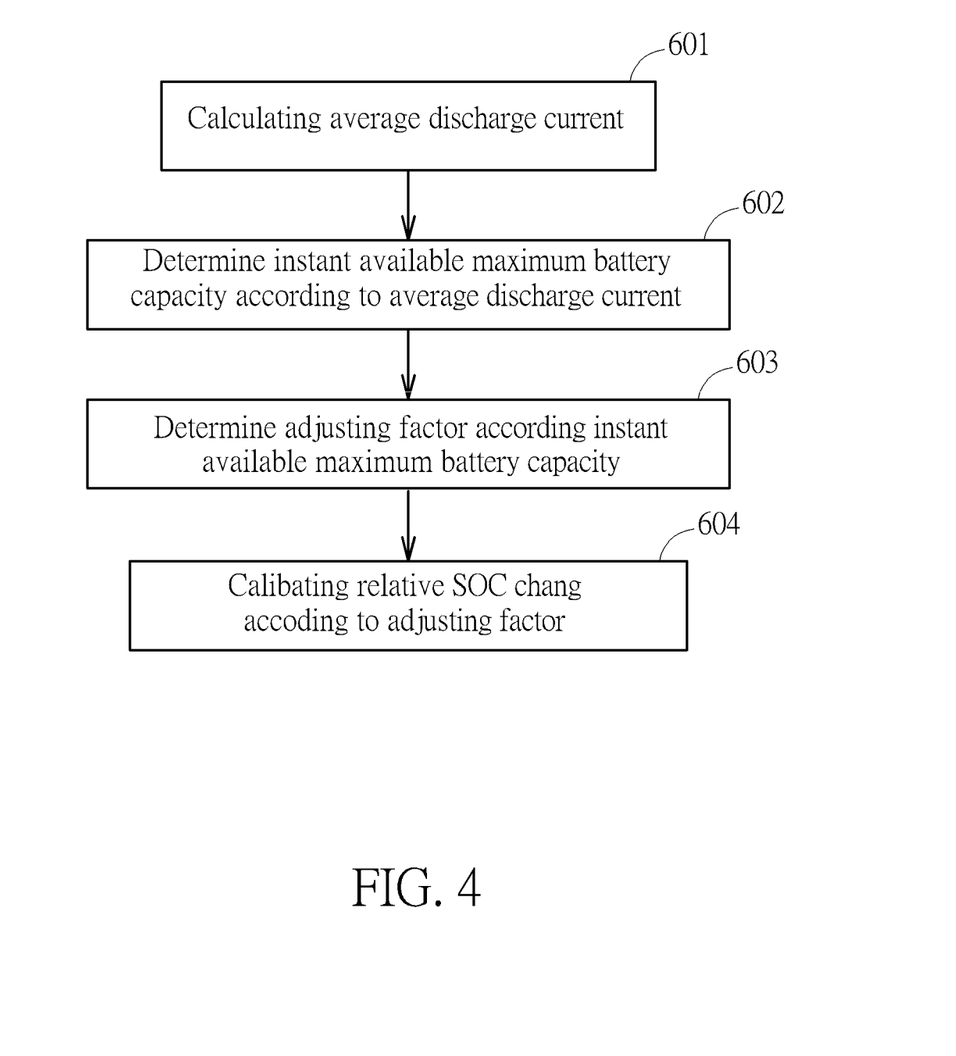
FIG. 4 illustrates a processing flow of the SOC estimation calibration system of FIG. 3 according to another embodiment of the present invention.

Please refer to FIG. 3 illustrating an SOC estimation calibration system 500 that is used for calibrating errors that is caused by loading on the battery cell 200 and further in conjunction with FIG. 4 for further details. The coulomb counting based SOC estimation calibration system 500 comprises an average discharge current calculation block 520, a battery parameter storage block 530, a battery capacity determination block 540, an adjusting factor determination block 560 and a calibration block 580. At step 601, the average discharge current calculation block 520 is arranged to calculate an average discharge current $I_{AVG}$ of the battery cell 200 within a given period of time, wherein the average discharge current $I_{AVG}$ reflects an instant loading on the battery cell 200. The average discharge current calculation block 520 may have a current detection block for detecting and sampling a discharge current of the battery cell 200 at certain sample rate, and after a certain time of samples is reached, the average discharge current calculation block 520 calculates the average discharge current $I_{AVG}$ according to all the sampled discharge currents.

A battery parameter storage block 530 may store multiple sets of known values of the discharge current associated with known values of the available maximum battery capacity. For example, a first current $I_1$, a second current $I_2$ and a first available maximum battery capacity $Q_{MAX\_I1}$ with respect the load of $I_1$ and a second available maximum battery capacity $Q_{MAX\_I2}$ with respect the load of $I_2$. At step 602, the battery capacity determination block 540 determines the available maximum battery capacity $Q_{MAX\_INST}$ under the loading of $I_{AVG}$. Specifically, the battery capacity determination block 540 performs an interpolation computation according to the first current $I_1$, the second current $I_2$ and the first available maximum battery capacity $Q_{MAX\_I1}$ with respect the load of $I_1$ and a second available maximum battery capacity $Q_{MAX\_I2}$ with respect the load of $I_2$ so as to obtain the instant available maximum battery capacity $Q_{MAX\_INST}$ at the loading of $I_{AVG}$, wherein $I_{AVG}$ needs to be smaller than $I_1$ but greater than $I_2$.

In another embodiment, the average discharge current calculation block 520 determines an instant cut-off voltage of the battery cell 200 with respect to the instant loading, using a known relationship between the OCV and the available maximum battery capacity. Similarly, the average discharge current calculation block 520 calculates the average discharge current $I_{AVG}$ of the battery cell 200 for reflecting the instant loading on the battery cell 200. Please refer to FIG. 5 for better understanding. According to the average discharge current calculates $I_{AVG}$, the battery capacity determination block 540 determines an instant cut-off voltage $V_{C\_LOAD}$ with respect to the instant loading of $I_{AVG}$. As the battery cell 200 has an internal resistance of $R_{INST}$, the instant cut-off voltage $V_{C\_LOAD}$ with respect to the loading of $I_{AVG}$ can be calculated by $(V_C + I_{AVG} * R_{INST})$, wherein $V_C$ is the cut off voltage when there is no loading on the battery cell 200, and the internal resistance of $R_{INST}$ at this time can also be known by checking the battery parameter storage block 530.

Figure 5:
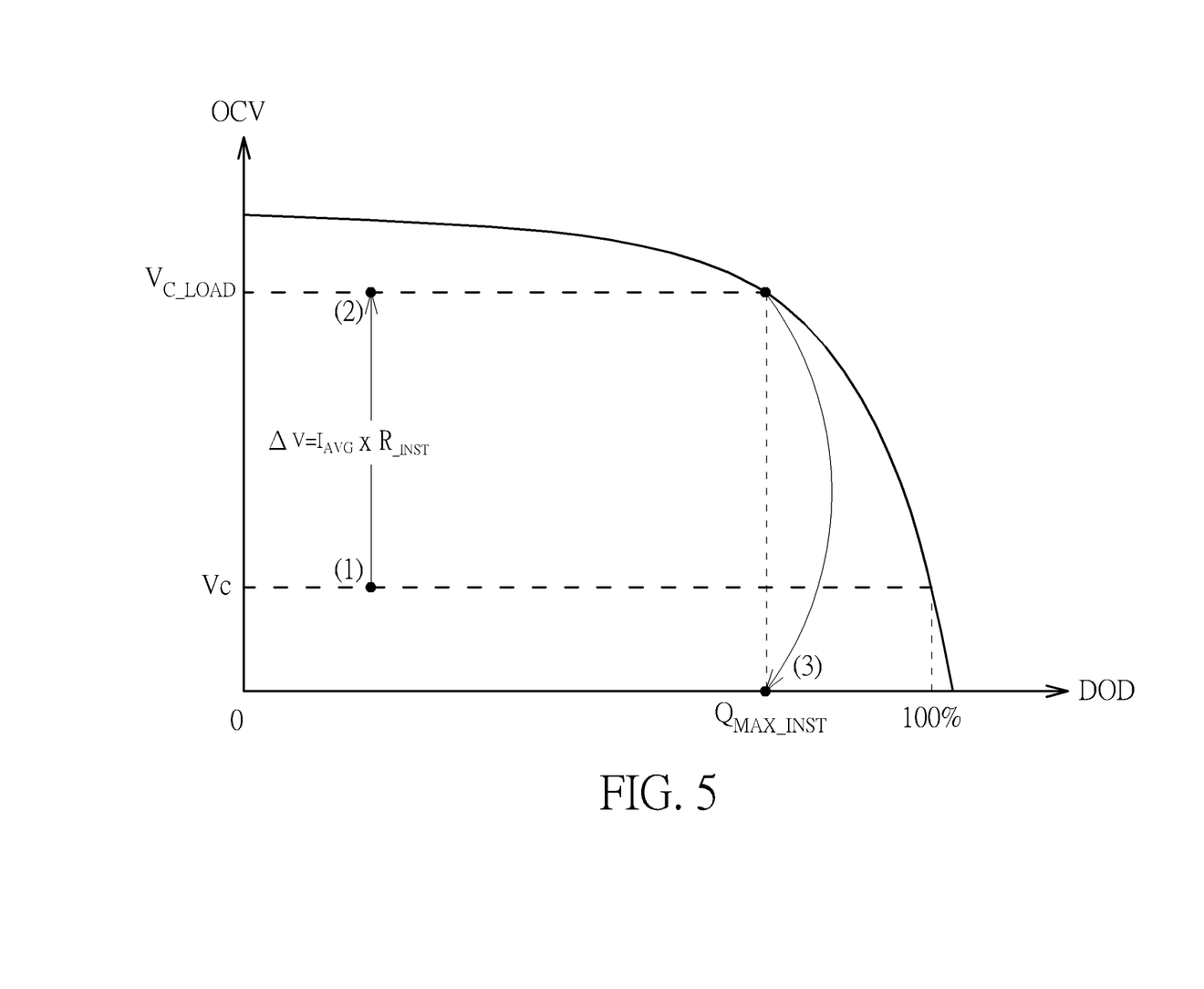
FIG. 5 illustrates how to determine an instant available maximum battery capacitor according to one embodiment of the present invention.

In addition, the battery parameter storage 530 may store a known relationship, e.g. in form of LUT, between the OCV the available maximum battery capacity (could be in form of depth of discharge as illustrated by FIG. 5). The battery capacity determination block 540 determines the instant available maximum battery capacity $Q_{MAX\_INST}$ with respect to the OCV of $V_{C\_LOAD}$ (i.e., with respect to the loading of $I_{AVG}$).

Furthermore, to determine the adjusting factor $F_2$, the instant available maximum battery capacity block 540 may estimate the total charge amount that flown into or out of the battery cell 200 in certain duration. For example, the instant available maximum battery capacity block 540 may estimate the total charge amount that flown into or out of the battery cell 200 when the SOC changes from 100% to 0, from 70% to 0, or from 30% to 100%. Once the total charge amount with respect to the above-mentioned certain duration is estimated, the instant available maximum battery capacity block 540 can estimate the instant available maximum battery capacity $Q_{MAX\_INST'}$. Accordingly, the adjusting factor determination block 560 can determine the adjusting factor $F_2$ based on instant available maximum battery capacity $Q_{MAX\_INST'}$ and the maximum battery capacity $Q_{MAX}$.

After the instant available maximum battery capacity $Q_{MAX\_INST}$ and $Q_{MAX\_INST'}$ are determined, the adjusting factor determination circuit 560 determines the adjusting factors $F_1$ and $F_2$ by calculating the ratios of $(Q_{MAX\_INST}/Q_{MAX})$ and $(Q_{MAX\_INST'}/Q_{MAX})$ at step 603. Accordingly, the calibration circuit 580 calibrates the relative SOC change $(Q_{INT}/Q_{MAX})$ that is determined by the coulomb counting based SOC estimation block 300 by applying the adjusting factors $F_1$ and $F_2$ to it at step 604. As a consequence, the calibrated relative SOC change will be $Q_{INT}/(Q_{MAX}*F_1*F_2) = Q_{INT}/(Q_{MAX}*(Q_{MAX\_INST}/Q_{MAX})*(Q_{MAX\_INST'}/Q_{MAX}))$, which faithfully reflect the influence of the change of the loading on the battery cell 200 and the aging of the battery cell 200.

In conclusion, the method and system provided by the present invention can effectively calibrating the errors in a coulomb counting based SOC estimation.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for calibrating a coulomb counting based state-of-charge (SOC) estimation of a battery cell, comprising:
  calculating an average discharge current of the battery cell;
  determining an instant available maximum battery capacity of the battery cell according to the average discharge current;
  determining an adjusting factor according to the instant available maximum battery capacity; and
  calibrating a relative SOC change for use in the coulomb counting based SOC estimation according to the adjusting factor.

2. The method of claim 1, wherein the step of determining the instant available maximum battery capacity according to the average discharge current comprises:
  determining a first-current available maximum battery capacity that is an available maximum battery capacity of the battery cell when the battery cell is discharged with a first current;
  determining a second-current available maximum battery capacity that is an available maximum battery capacity of the battery cell when the battery cell is discharged with a second current that is different from the first current; and
  determining the instant available maximum battery capacity by an interpolating computation according to the first current, the second current, the first-current available maximum battery capacity and the second-current available maximum battery capacity.

3. The method of claim 1, wherein the step of determining the instant available maximum battery capacity according to the average discharge current comprises:
  determining a cut-off voltage of the battery cell;
  determining an instant internal resistance of the battery cell;
  determining an instant cut-off voltage with respect to the average discharge current according to the average discharge current, the cut-off voltage and the instant internal resistance; and
  determining the instant available maximum battery capacity according to the instant cut-off voltage with respect to the average discharge current and a relationship between the OCV and available maximum battery capacity.

4. The method of claim 1, wherein the step of determining the adjusting factor according to the instant available maximum battery capacity comprises:
  dividing the instant available maximum battery capacity by a zero-current maximum battery capacity that is an available maximum battery capacity of the battery cell when the battery cell is not discharged to determine the adjusting factor.

5. The method of claim 4, wherein the relative SOC change is determined by a ratio of an integrated charge amount flown through the battery cell to the zero-current maximum battery capacity and the step of adjusting the relative SOC change according to the adjusting factor comprises:
  dividing the relative SOC change by the adjusting factor.

* * * * *